United States Patent
Linthicum et al.

(10) Patent No.: US 6,403,451 B1
(45) Date of Patent: Jun. 11, 2002

(54) METHODS OF FABRICATING GALLIUM NITRIDE SEMICONDUCTOR LAYERS ON SUBSTRATES INCLUDING NON-GALLIUM NITRIDE POSTS

(75) Inventors: Kevin J. Linthicum, Angier; Thomas Gehrke, Carrboro; Robert F. Davis, Raleigh, all of NC (US)

(73) Assignee: Noerh Carolina State University, Raleigh, NC (US)

( * ) Notice: Subject to any disclaimer, the term of this patent is extended or adjusted under 35 U.S.C. 154(b) by 0 days.

(21) Appl. No.: 09/501,051

(22) Filed: Feb. 9, 2000

(51) Int. Cl.$^7$ ............................................. H01L 21/20
(52) U.S. Cl. ........................ 438/479; 481/483
(58) Field of Search ............................. 438/22, 24, 46, 438/39, 41, 42, 43, 478, 479, 481, 483, 503

(56) References Cited

U.S. PATENT DOCUMENTS

| | | | |
|---|---|---|---|
| 4,127,792 A | 11/1978 | Nakata | 313/500 |
| 4,522,661 A | 6/1985 | Morrison et al. | 148/33.2 |

(List continued on next page.)

FOREIGN PATENT DOCUMENTS

| | | |
|---|---|---|
| CA | 2258080 | 10/1998 |
| EP | 0 551 721 A2 | 7/1993 |

(List continued on next page.)

OTHER PUBLICATIONS

Honda et al., Selective Area Growth of GaN Microstructures on Patterned (111) and (001) Si Substrates, 4$^{th}$ European Workshop on GaN, Nottingham, UK, Jul. 2–5, 2000.

Gehrke et al., Pendeo–Epitaxial Growth of Gallium Nitride on Silicon Substrates, Journal of Electronic Materials, vol. 29, No. 3, Mar. 2000, pp. 306–310.

(List continued on next page.)

*Primary Examiner*—Savitri Mulpuri

(57) ABSTRACT

A substrate includes non-gallium nitride posts that define trenches therebetween, wherein the non-gallium nitride posts include non-gallium nitride sidewalls and non-gallium nitride tops and the trenches include non-gallium floors. Gallium nitride is grown on the non-gallium nitride posts, including on the non-gallium nitride tops. Preferably, gallium nitride pyramids are grown on the non-gallium nitride tops and gallium nitride then is grown on the gallium nitride pyramids. The gallium nitride pyramids preferably are grown at a first temperature and the gallium nitride preferably is grown on the pyramids at a second temperature that is higher than the first temperature. The first temperature preferably is about 1000° C. or less and the second temperature preferably is about 1100° C. or more. However, other than temperature, the same processing conditions preferably are used for both growth steps. The grown gallium nitride on the pyramids preferably coalesces to form a continuous gallium nitride layer. Accordingly, gallium nitride may be grown without the need to form masks during the gallium nitride growth process. Moreover, the gallium nitride growth may be performed using the same processing conditions other than temperatures changes. Accordingly, uninterrupted gallium nitride growth may be performed.

18 Claims, 2 Drawing Sheets

U.S. PATENT DOCUMENTS

| | | | |
|---|---|---|---|
| 4,651,407 A | 3/1987 | Bencuya | 29/571 |
| 4,865,685 A | 9/1989 | Palmour | 156/643 |
| 4,876,210 A | 10/1989 | Barnett et al. | 437/5 |
| 4,912,064 A | 3/1990 | Kong et al. | 437/100 |
| 4,946,547 A | 8/1990 | Palmour et al. | 156/643 |
| 5,122,845 A | 6/1992 | Manabe et al. | 357/17 |
| 5,156,995 A | 10/1992 | Fitzgerald, Jr. et al. | 437/90 |
| RE34,861 E | 2/1995 | Davis et al. | 437/100 |
| 5,389,571 A | 2/1995 | Takeuchi et al. | 437/133 |
| 5,397,736 A | 3/1995 | Bauser et al. | 437/92 |
| 5,549,747 A | 8/1996 | Bozler et al. | 117/43 |
| 5,710,057 A | 1/1998 | Kenney | 437/62 |
| 5,760,426 A | 6/1998 | Marx et al. | 257/190 |
| 5,786,606 A | 7/1998 | Nishio et al. | 257/103 |
| 5,815,520 A | 9/1998 | Furushima | 372/45 |
| 5,877,070 A | 3/1999 | Goesele et al. | 438/458 |
| 5,880,485 A | 3/1999 | Marx et al. | 257/94 |
| 5,912,477 A | 6/1999 | Negley | 257/95 |
| 5,915,194 A | 6/1999 | Powell et al. | 438/478 |
| 6,051,849 A | 4/2000 | Davis et al. | 257/103 |
| 6,064,078 A | 5/2000 | Northrup et al. | 257/96 |
| 6,100,104 A | 8/2000 | Haerle | 438/33 |
| 6,100,111 A | 8/2000 | Konstantinov | 438/92 |
| 6,121,121 A | 9/2000 | Koide | 438/481 |
| 6,153,010 A | 11/2000 | Kiyoku et al. | 117/95 |
| 6,156,584 A | 12/2000 | Itoh et al. | 438/33 |

FOREIGN PATENT DOCUMENTS

| | | |
|---|---|---|
| EP | 0 852 416 A1 | 7/1998 |
| EP | 0 884 767 A2 | 12/1998 |
| EP | 0 942 459 A1 | 9/1999 |
| EP | 0 951 055 A2 | 10/1999 |
| JP | 3-132016 | 6/1991 |
| JP | 4-188678 | 7/1992 |
| JP | 5-7016 | 1/1993 |
| JP | 5-41536 | 2/1993 |
| JP | 8-18159 | 1/1996 |
| JP | 08-064791 | 3/1996 |
| JP | 8-116093 | 5/1996 |
| JP | 8-125251 | 5/1996 |
| JP | 8-153931 | 6/1996 |
| JP | 9-93315 | 4/1997 |
| JP | 9-174494 | 6/1997 |
| JP | 9-181071 | 7/1997 |
| JP | 9-201477 | 7/1997 |
| JP | 9-277448 | 10/1997 |
| JP | 9-290098 | 10/1997 |
| JP | 9-324997 | 11/1997 |
| JP | 11-145516 | 5/1999 |
| WO | WO 97/11518 | 3/1997 |
| WO | WO 98/47170 | 10/1998 |
| WO | WO 99/18617 | 4/1999 |
| WO | WO 99/44224 | 9/1999 |

OTHER PUBLICATIONS

International Search Report, PCT/US00/40724, Feb. 27, 2001.

Zeng et al., Optical Properties of GaN Pyramids, Applied Physics Letters, vol. 74, No. 9, Mar. 1, 1999, pp. 1227–1229.

Gallium Nitride–2000–Technology, Status, Applications and Market Forecasts, Strategies Unlimited, Report SC–23, May 2000.

Chen et al., Dislocation Reducing in GaN Thin Films Via Lateral Overgrowth From Trenches, Applied Physics Letters, vol. 75, No. 14, Oct. 4, 1999, pp. 2062–2063.

Nakamura, InGaN/GaN/AlGaN–Based Laser Diodes, Properties, Processing and Applications of Gallium Nitride and Related Semiconductors, EMIS Datareviews Series No. 23, 1998, pp. 587–595.

Hiramatsu et al., Selective Area Growth and Epitaxial Lateral Overgrowth of GaN, Properties, Processing and Applications of Gallium Nitride and Related Semiconductors, EMIS Datareviews, Series No. 23, 1998, pp. 440–446.

Sakai, Defect Structure in Selectively Grown GaN Films With Low Threading Dislocation Density, Appl. Phys. Lett., vol. 71, No. 16, Oct. 20, 1997, pp. 2259–2261.

Gustafsson et al., Investigations of High Quality $Ge_xSi_{1-x}$ Grown by Heteroepitaxial Lateral Overgrowth Using Cathoduluminescence, Inst. Phys. Conf. Ser. No. 134: Section 11, Micros. Semicond. Mater. Conf., Oxford, Apr. 5–8, 1993, pp. 675–678.

Givargizov, Other Approaches to Oriented Crystallization on Amorphous Substrates, Chapter 4, Oriented Crystallization on Amorphous Substrates, Plenum Press, 1991, pp. 221–264.

Akasaki et al., Effects of AlN Buffer Layer on Crystallographic Structure and on Electrical and Optical Properties of GaN and $Ga_{1-x}Al_xN$ ($0<x\leq0.4$) Films Grown on Sapphire Substrate by MOVPE, Journal of Crystal Growth, vol. 98, 1989, pp. 209–219.

Ujiie et al., Epitaxial Lateral Overgrowth of GaAs on a Si Substrate, Jpn. J. Appl. Phys., vol. 28, 1989, p. L337–L339.

Ishiwara et al., Lateral Solid Phase Epitaxy of Amorphous Si Films on Si Substrates With $SiO_2$ Patterns, Applied Physics Letters, vol. 43, No. 11, Dec. 1, 1983, pp. 1028–1030.

Jastrzebski, SOI by CVD: Epitaxial Lateral Overgrowth (ELO) Process–Review, Journal of Crystal Growth, vol. 63, 1983, pp. 493–526.

Rathman et al., Lateral Epitaxial Overgrowth of Silicon on $SiO_2$, Journal of the Electrochemical Society, Oct. 1982, pp. 2303–2306.

Shaw, Selective Epitaxial Deposition of Gallium Arsenide in Holes, Journal of the Electrochemical Society, Sep. 1966, pp. 904–908.

Tausch, Jr. et al., A Novel Crystal Growth Phenomenon: Single Crystal GaAs Overgrowth Onto Silicon Dioxide, Journal of the Electrochemical Society, Jul. 1965, pp. 706–709.

Joyce et al., Selective Epitaxial Deposition of Silicon, Nature, vol. 4840, Aug. 4, 1962, pp. 485–486.

International Search Report, PCT/US99/27358, Apr. 28, 2000.

Nakamura, InGaN–Based Violet Laser Diodes, Semicond. Sci. Technol., 14, 1999, pp. R27–R40.

Nakamura et al., Violet InGaN/GaN/AlGaN–Based Laser Diodes Operable at 50° C. With a Fundamental Transverse Mode, Jpn. J. Appl. Phys. vol. 38, Part 1, No. 3A, Mar. 1, 1999, pp. L226–L229.

Boo et al., Growth of Hexagonal GaN Thin Films on Si(111) with Cubic SiC Buffer Layers, Journal of Crystal Growth 189–190, 1998, pp. 183–188.

Linthicum et al., Process Routes for Low–Defect Density GaN on Various Substrates Employing Pendeo–Epitaxial Growth Techniques, MRS Internet Journal of Nitride Semiconductor Research, Fall Meeting of the Materials Research Society, vol. 4S1, No. G4.9, Nov. 30, 1998–Dec. 4, 1998.

Steckl et al., SiC Rapid Thermal Corbonization of the (111)Si Semiconductor–on–Insulator Structure and Subsequent Metalorganic Chemical Vapor Deposition, Appl. Phys. Let., 69(15), Oct. 7, 1996, pp. 2264–2266.

International Search Report, PCT/US99/28056, Apr. 26, 2000.

International Search Report, PCT/US99/04346, Jun. 9, 1999.

International Search Report, PCT/US99/12967, Oct. 18, 1999.

Linthicum et al., Pendeoepitaxy of Gallium Nitride Thin Films, Applied Physics Letters, vol. 75, No. 2, Jul. 12, 1999, pp. 196–198.

Zheleva et al., Pendeo–Epitaxy: A New Approach for Lateral Growth of Gallium Nitride Films, Journal of Electronic Materials, vol. 28, No. 4, Feb. 1999, pp. L5–L8.

Zheleva et al., Pendeo–Epitaxy–A New Approach for Lateral Growth of GaN Structures, MRS Internet Journal of Nitride Semiconductor Research, 1999, Online!, vol. 4S1, No. G3.38, Nov. 30, 1998–Dec. 4, 1998.

Nakamura et al., InGaN/GaN/AlGaN–Based Laser Diodes Grown on GaN Substrates With a Fundamental Transverse Mode, Jpn. J. Appl. Phys., vol. 37, Sep. 15, 1998, pp. L1020–L1022.

Marchand et al., Microstructure of GaN Laterally Overgrown by Metalorganic Chemical Vapor Deposition, Applied Physics Letters, vol. 73, No. 6, Aug. 10, 1998, pp. 747–749.

Sakai et al., Transmission Electron Microscopy of Defects in GaN Films Formed by Epitaxial Lateral Overgrowth, vol. 73, No. 4, Jul. 27, 1998, pp. 481–483.

Nakamura et al., High–Power, Long–Lifetime InGaN/GaN/AlGaN–Based Laser Diodes Grown on Pure GaN Substrates, Jpn. J. Appl. Phys., vol. 37, Mar. 15, 1998, pp. L309–L312.

Nam et al., Lateral Epitaxial Overgrowth of GaN Films on $SiO_2$ Areas Via Metalorganic Vapor Phase Epitaxy, Journal of Electronic Materials, vol. 27, No. 4, 1998, pp. 233–237.

Wu et al., Growth and Characterization of SiC Films on Large–Area Si Wafers by APCVD–Temperature Dependence, Materials Science Forum, vols. 264–268, 1998, pp. 179–182.

Nakamura et al., InGaN/GaN/AlGaN–Based Laser Diodes With Modulation–Doped Strained–Layer Superlattices, Jpn. J. Appl. Phys., vol. 36, Dec. 1, 1997, pp. L1568–L1571.

Kapolnek et al., "Anisotropic Epitaxial Lateral Growth in GaN Selective Area Epitaxy", Appl. Phys. Lett. 71 (9), 1 Sep. 1997, pp. 1204–1206.

Usui et al., "Thick GaN Epitaxial Growth With Low Dislocation Density by Hydride Vapor Phase Epitaxy", Jpn. J. Appl. Phys., vol. 36, Part 2, No. 7B, 15 Jul. 1997, pp. 899–902.

Nam et al., Lateral Epitaxy of Low Defect Density GaN Layers Via Organometallic Vapor Phase Epitaxy, Appl. Phys. Lett., vol. 71, No. 18, Nov. 3, 1997, pp. 2638–2640.

Zheleva et al., Dislocation Density Reduction Via Lateral Epitaxy in Selectively Grown GaN Structures, Appl. Phys. Lett., vol. 71, No. 17, Oct. 27, 1997, pp. 2472–2474.

Nam, et al., "Growth of GaN and $Al_{0.2}Ga_{0.8}N$ on Patterned Substrates Via Organometallic Vapor Phase Epitaxy", Jpn. J. Appl. Phys., vol. 36, Part 2, No. 5A, 1 May 1997, pp. 532–535.

Nam et al., "Selective Growth of GaN and $Al_{0.2}Ga_{0.8}N$ on GaN/AlN/6H–SiC(0001) Multilayer Substrates Via Organometallic Vapor Phase Epitaxy", Proceedings MRS, Dec. 1996, 6 pp.

Kapolnek et al., "Selective Area Epitaxy of GaN for Electron Field Emission Devices", Journal of Crystal Growth, 5451, 1996, pp. 1–4.

Weeks et al, "GaN Thin Films Deposited Via Organometallic Vapor Phase Epitaxy on $\alpha(6H)$–SiC(0001) Using High–Temperature Monocrystalline AlN Buffer Layers", Appl. Phys. Lett. 67(3), Jul. 17, 1995, pp. 401–403.

Doverspike et al., The Effect of GaN and AlN Buffer Layers on GaN Film Properties Grown on Both C–Plane and A–Plane Sapphire, Journal of Electronic Materials, vol. 24, No. 4, 1995, pp. 269–273.

Kato et al., "Selective Growth of Wurtzite GaN and $Al_xGa_{1-x}N$ on GaN/Sapphire Substrates by Metalorganic Vapor Phase Epitaxy" Journal of Crystal Growth, 144, 1994, pp. 133–140.

Kuznia et al., Influence of Buffer Layers on the Deposition of High Quality Single Crystal GaN Over Sapphire Substrates, J. Appl. Phys., vol. 73, No. 9, May 1, 1993, pp. 4700–4702.

Watanabe et al., The Growth of Single Crystalline GaN on a Si Substrate Using AlN As An Intermediate Layer, Journal of Crystal Growth, vol. 128, 1993, pp. 391–396.

Yamaguchi et al, "Lateral Supply Mechanisms in Selective Metalorganic Chemical Vapor Deposition", Jpn. Appl. Phys., vol. 32 (1993), pp. 1523–1527.

Nakamura, GaN Growth Using GaN Buffer Layer, Japanese Journal of Applied Physics, vol. 30, No. 10A, Oct. 1991, pp. L1705–L1707.

Chen et al., Silicon–on–Insulator: Why, How, and When, AIP Conference Proceedings, vol. 167, No. 1, Sep. 15, 1988, pp. 310–319.

Amano et al., Metalorganic Vapor Phase Epitaxial Growth of a High Quality GaN Film Using an AlN Buffer Layer, Applied Physics Letters, vol. 48, No. 5, Feb. 3, 1986, pp. 353–355.

Yoshida et al., Improvements on the Electrical and Luminescent Properties of Reactive Molecular Beam Epitaxially Grown GaN Films by Using AlN–Coated Sapphire Substrates, Applied Physics Letters, vol. 42, No. 5, Mar. 1, 1983, pp. 427–429.

Leo Unmasked by Pendeo–Epitaxy, Compound Semiconductor, Mar. 1999, p. 16.

Gehrke et al., Pendeo–Epitaxy of Gallium Nitride and Aluminum Nitride Films and Heterostructures on Silicon Carbide Substrates, MRS Internet J. Semicond. Res. 4S1, G3.2, 1999 6 pp.

Thomson et al., Ranges of Deposition Temperatures Applicable for Metalorganic Vapor Phase Epitaxy of GaN Films Via the Technique of Pendeo–Epitaxy, MRS Internet J. Semicond. Res. 4S1, G3.37, 1999, 6 pp.

METHODS OF FABRICATING GALLIUM NITRIDE SEMICONDUCTOR LAYERS ON SUBSTRATES INCLUDING NON-GALLIUM NITRIDE POSTS

FEDERALLY SPONSORED RESEARCH

This invention was made with Government support under Office of Naval Research Contract Nos. N00014-96-1-0765, N00014-98-1-0384, and N00014-98-1-0654. The Government may have certain rights to this invention.

FIELD OF THE INVENTION

This invention relates to microelectronic devices and fabrication methods, nitride based compound semiconductor materials and more particularly to gallium nitride semiconductor devices and fabrication methods therefor.

BACKGROUND OF THE INVENTION

Gallium nitride is being widely investigated for microelectronic devices including but not limited to transistors, field emitters and optoelectronic devices. It will be understood that, as used herein, gallium nitride also includes alloys of gallium nitride such as aluminum gallium nitride, indium gallium nitride and aluminum indium gallium nitride.

A major problem in fabricating gallium nitride-based microelectronic devices is the fabrication of gallium nitride semiconductor layers having low defect densities. It is known that one contributor to defect density is the substrate on which the gallium nitride layer is grown. Accordingly, although gallium nitride layers have been grown on sapphire substrates, it is known to reduce defect density by growing gallium nitride layers on aluminum nitride buffer layers which are themselves formed on silicon carbide substrates. Notwithstanding these advances, continued reduction in density is desirable.

It also is known to produce low defect density gallium nitride layers by forming a mask on a layer of gallium nitride, the mask including at least one opening therein that exposes the underlying layer of gallium nitride, and laterally growing the underlying layer of gallium nitride through the at least one opening and onto the mask. This technique often is referred to as "Epitaxial Lateral Overgrowth" (ELO). The layer of gallium nitride may be laterally grown until the gallium nitride coalesces on the mask to form a single layer on the mask. In order to form a continuous layer of gallium nitride with relatively low defect density, a second mask may be formed on the laterally overgrown gallium nitride layer, that includes at least one opening that is offset from the opening in the underlying mask. ELO then again is performed through the openings in the second mask to thereby overgrow a second low defect density continuous gallium nitride layer. Microelectronic devices then may be formed in this second overgrown layer. ELO of gallium nitride is described, for example, in the publications entitled *Lateral Epitaxy of Low Defect Density GaN Layers Via Organometallic Vapor Phase Epitaxy* to Nam et al., Appl. Phys. Lett. Vol. 71, No. 18, Nov. 3, 1997, pp. 2638–2640; and *Dislocation Density Reduction Via Lateral Epitaxy in Selectively Grown GaN Structures* to Zheleva et al, Appl. Phys. Lett., Vol. 71, No. 17, Oct. 27, 1997, pp. 2472–2474, the disclosures of which are hereby incorporated herein by reference.

It also is known to produce a layer of gallium nitride with low defect density by forming at least one trench or post in an underlying layer of gallium nitride to define at least one sidewall therein. A layer of gallium nitride is then laterally grown from the at least one sidewall. Lateral growth preferably takes place until the laterally grown layers coalesce within the trenches. Lateral growth also preferably continues until the gallium nitride layer that is grown from the sidewalls laterally overgrows onto the tops of the posts. In order to facilitate lateral growth and produce nucleation of gallium nitride and growth in the vertical direction, the top of the posts and/or the trench floors may be masked. Lateral growth from the sidewalls of trenches and/or posts also is referred to as "pendeoepitaxy" and is described, for example, in publications entitled *Pendeo-Epitaxy: A New Approach for Lateral Growth of Gallium Nitride Films* by Zheleva et al., Journal of Electronic Materials, Vol. 28, No. 4, Feb. 1999, pp. L5-L8; and *Pendeoepitaxy of Gallium Nitride Thin Films* by Linthicum et al., Applied Physics Letters, Vol. 75, No. 2, Jul. 1999, pp. 196–198, the disclosures of which are hereby incorporated herein by reference.

Unfortunately, both ELO and pendeoepitaxy may use one or more masks to mask portions of an underlying gallium nitride layer during ELO and/or pendeoepitaxy. These masks may complicate the fabrication process. Moreover, multiple growth steps of gallium nitride may be needed with mask formation therebetween. These multiple growth steps also may complicate the fabrication processes, because the structures may need to be removed from the gallium nitride growth chamber in order to form the mask or masks. Accordingly, notwithstanding the recent advances in ELO and pendeoepitaxy, there continues to be a need for methods of fabricating gallium nitride semiconductor layers that do not need masking layers and/or need not interrupt the gallium nitride growth process.

SUMMARY OF THE INVENTION

The present invention provides a substrate including non-gallium nitride posts that define trenches therebetween, wherein the non-gallium nitride posts include non-gallium nitride sidewalls and non-gallium nitride tops, and the trenches include non-gallium floors. These substrates also may be referred to herein as "textured" substrates. Then, gallium nitride is grown on the non-gallium nitride posts, including on the non-gallium nitride tops. Preferably, gallium nitride pyramids are grown on the non-gallium nitride tops and gallium nitride then is grown on the gallium nitride pyramids. The gallium nitride pyramids preferably are grown at a first temperature and the gallium nitride preferably is grown on the pyramids at a second temperature that is higher than the first temperature. The first temperature preferably is about 1000° C. or less and the second temperature preferably is about 1100° C. or more. However, other than temperature, the same processing conditions preferably are used for both growth steps. The grown gallium nitride on the pyramids preferably coalesces to form a continuous gallium nitride layer.

Accordingly, gallium nitride may be grown on a textured substrate, without the need to provide masks during the gallium nitride growth process. Moreover, the gallium nitride growth may be performed using the same processing conditions other than temperatures changes. Accordingly, uninterrupted gallium nitride growth may be performed. Simplified processing conditions therefore may be employed to grow a gallium nitride layer having low defect densities, for example defect densities of less than about $10^5$ cm$^{-2}$.

During growth of the gallium nitride pyramids on the non-gallium nitride tops, gallium nitride pyramids also may be simultaneously grown on the non-gallium nitride floors. Moreover, a conformal gallium nitride layer also may be formed simultaneously on the sidewalls, between the gallium nitride pyramids on the non-gallium nitride tops and on the non-gallium nitride floors. Upon growing the gallium nitride on the pyramids, the trenches also may be simultaneously filled with gallium nitride. A conformal buffer layer may be formed on the substrate including on the non-gallium nitride sidewalls, the non-gallium nitride tops and the non-gallium nitride floors, prior to growing the gallium nitride pyramids. For example, a conformal layer of aluminum nitride may be used.

Gallium nitride semiconductor structures therefore may be fabricated, according to the present invention, by providing a textured substrate, including a plurality of non-gallium nitride posts that define trenches therebetween, wherein the non-gallium nitride posts include non-gallium nitride sidewalls and non-gallium nitride tops, and the trenches include non-gallium nitride floors. The substrate preferably is free of masking materials on the non-gallium nitride floors and on the non-gallium nitride tops. Gallium nitride then is grown at a first temperature and the growth of gallium nitride then is continued at a second temperature that is higher than the first temperature. Growth at the second temperature preferably continues until the gallium nitride forms a continuous gallium nitride layer on the substrate.

Gallium nitride semiconductor structures according to the present invention preferably comprise a textured substrate including a plurality of non-gallium nitride posts that define trenches therebetween, the non-gallium nitride posts including non-gallium nitride sidewalls and non-gallium nitride tops, and the trenches including non-gallium nitride floors. A gallium nitride layer is provided on the non-gallium nitride posts including on the non-gallium nitride tops. The gallium nitride semiconductor structure preferably is free of a masking layer on the non-gallium nitride tops and on the non-gallium nitride floors. The gallium nitride layer preferably comprises gallium nitride pyramids on the non-gallium nitride tops. The gallium nitride layer may also include gallium nitride regions on the gallium nitride pyramids. Second gallium nitride pyramids on the non-gallium nitride floors also may be provided. A conformal gallium nitride layer on the sidewalls, between the gallium nitride pyramids and the second gallium nitride pyramids also may be provided. The gallium nitride regions preferably form a continuous gallium nitride layer and the gallium nitride layer also preferably fills the trenches. A conformal buffer layer also may be provided on the substrate wherein the gallium nitride layer is on the conformal buffer layer opposite the substrate.

The present invention most preferably may be used to provide methods of fabricating gallium nitride semiconductor structures that need not include masking or interruptions during gallium nitride epitaxial growth. Accordingly, simplified processes for fabricating gallium nitride semiconductor structures may be provided, to thereby fulfill a need in the fledgling gallium nitride semiconductor industry. However, it also will be understood that the present invention may be used to fabricate non-gallium nitride semiconductor structures wherein a textured substrate of a first material is provided and a second semiconductor material is grown on the posts including on the tops that comprise the first material. Also, semiconductor structures may be provided including a textured substrate that comprises a first material and a layer of second semiconductor material on the posts that comprise the first material.

DETAILED DESCRIPTION OF PREFERRED EMBODIMENTS

Figure 1:
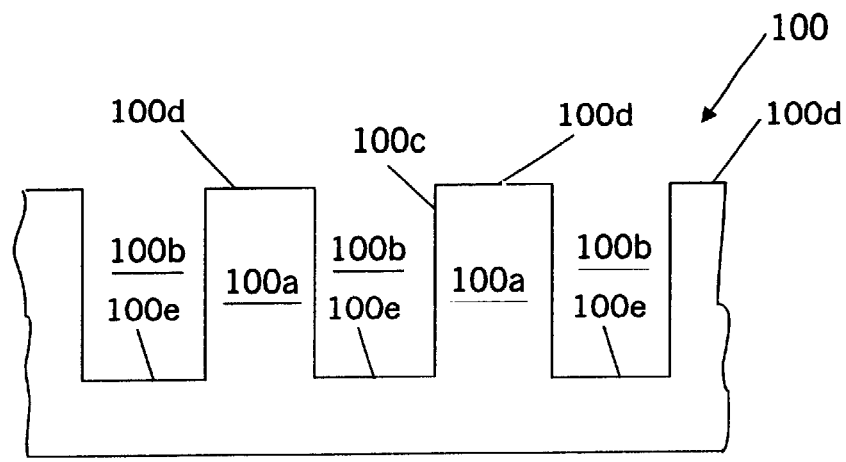
FIGS. 1–6 are cross-sectional views of gallium nitride semiconductor structures during intermediate fabrication steps, according to the present invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present. Moreover, each embodiment described and illustrated herein includes its complementary conductivity type embodiment as well.

Referring now to FIGS. 1–6, methods of fabricating gallium nitride semiconductor structures according to embodiments of the present invention now will be described. As shown in FIG. 1, a substrate 100, also referred to as a "textured substrate", is provided including a plurality of non-gallium nitride posts 100a that define trenches 100b therebetween. The non-gallium nitride posts 100a include non-gallium nitride sidewalls 100c and non-gallium nitride tops 100d. The trenches 100b also include non-gallium nitride floors 100e.

It will be understood by those having skill in the art that the substrate 100 may be a monocrystalline substrate or a substrate including one or more monocrystalline layers thereon, from which the posts 100a and trenches 100b are defined. Examples of monocrystalline substrates and monocrystalline layers include, but are not limited to, monocrystalline silicon, silicon carbide and/or sapphire. It also will be understood that the posts 100a and trenches 100b may be defined using selective etching and/or selective epitaxial growth. Etching may be performed using standard dry or wet etching techniques, preferably using a mask, which then preferably is removed. The fabrication of a substrate including trenches and posts is well known to those having skill in the art and need not be described in detail herein.

As will be shown below, by texturing the substrate 100, the substrate surface area that is available to contribute to defect formation during subsequent gallium nitride seed deposition may be reduced and preferably minimized. Texturing also may reduce crack formation in the final gallium nitride semiconductor layer by providing stress relief during cooling. Stress may occur due to mismatches in the coefficients of thermal expansion between the substrate material and gallium nitride that is formed subsequently.

It also will be understood that the trenches 100b preferably are sufficiently deep so that undesirable growth of poor quality gallium nitride from the trench floor 100e will not interfere with growth of high quality gallium nitride, as will be described below. Moreover, the posts 100a preferably are grown in the form of stripes that preferably are sufficiently narrow, for example less than or equal to one micron in width, so that small gallium nitride seed pyramids can be formed on the non-gallium nitride tops 100d. As will be described below, the initial gallium nitride seed pyramids that form on the non-gallium nitride tops 100d may have defects, so that the reduced size gallium nitride seed pyramids can reduce the total amount of initial defective gallium nitride seed material. The total mechanical stress on the pyramids due to the differences in coefficients of thermal expansion between the substrate, any conformal buffer layers and the grown gallium nitride also may be reduced, as well as the time to complete the pyramidal growth and initiate pendeoepitaxial growth as will be described below.

When the posts 100a are in the form of stripes, the stripes preferably extend along the $1\overline{1}00$ direction of a sapphire or silicon carbide substrate 100 and along the 110 direction of a silicon substrate 100, to thereby expose the $1\overline{1}20$ plane of the subsequently grown gallium nitride layer. In general, the stripes should expose the $1\overline{1}20$ plane of sapphire and silicon carbide substrates. For example, if A-plane sapphire is used, as opposed to C-plane sapphire which is more common, then the wafer flat is the 0001 direction. In order to expose the $1\overline{1}20$ plane, etching is performed parallel to the flat or the 0001 direction. However, it also will be understood that the sidewalls 100c may not be orthogonal to the substrate 100, but rather may be oblique thereto. Finally, it also will be understood that, although the sidewalls 100c are shown in cross-section in FIG. 1, the posts 100a and trenches 100b may define elongated regions that are straight, V-shaped or have other shapes. The spaced apart posts 100a also may be referred to as "mesas", "pedestals" or "columns". The trenches 100b also may be referred to as "wells".

Figure 2:
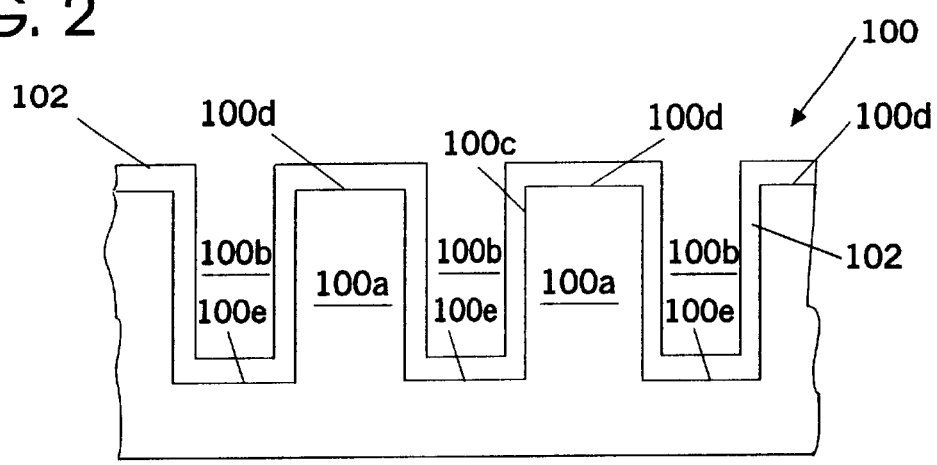

Referring now to FIG. 2, an optional conformal buffer layer 102 then may be formed on the substrate 100 including on the non-gallium nitride sidewalls 100c, the non-gallium nitride tops 100d and the non-gallium nitride floors 100e. When the non-gallium nitride posts 100a comprise silicon, the buffer layer may comprise silicon carbide and/or aluminum nitride. When the non-gallium nitride posts 100a comprise silicon carbide, the buffer layer 102 may comprise high temperature aluminum nitride. Finally, when the non-gallium nitride posts 100a comprise sapphire, the conformal buffer layer 102 may comprise low temperature gallium nitride and/or aluminum nitride. Other buffer layers may be used with these and other non-gallium nitride posts 100a. The fabrication of a buffer layer on a substrate is well known to those having skill in the art and need not be described in detail herein.

Figure 3:
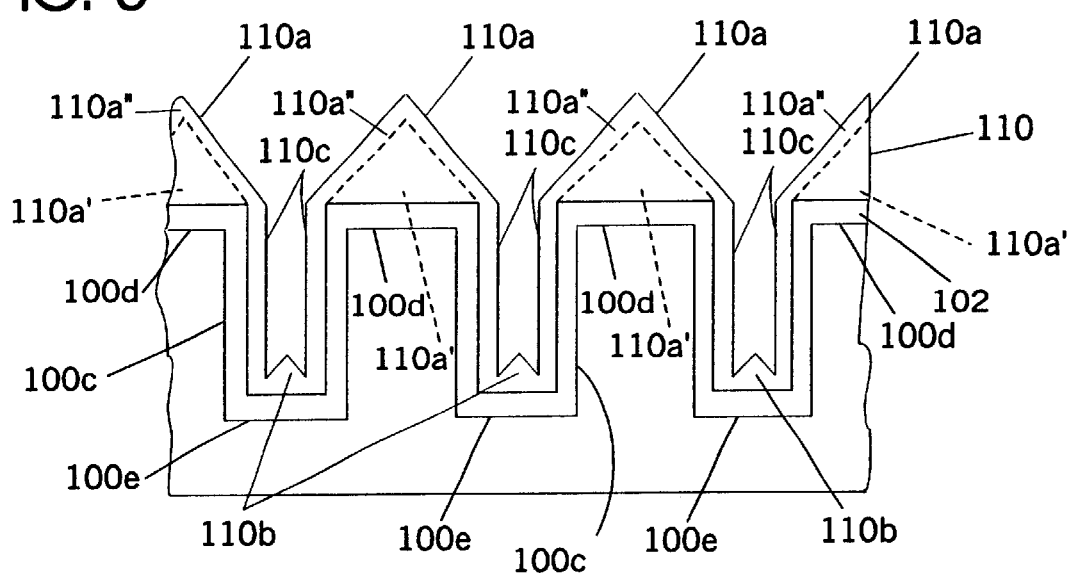

Referring now to FIG. 3, gallium nitride is grown on the non-gallium nitride posts 100a including on the non-gallium nitride tops 100d. More specifically, a gallium nitride layer 110 is formed, wherein the gallium nitride layer includes gallium nitride pyramids 110a on the non-gallium nitride tops 100d. These pyramids 110a also may be referred to as "seed forms". It will be understood that the seed forms need not be pyramidal in shape but rather may have flash tops. As also shown in FIG. 3, second gallium nitride pyramids 110b also may be formed simultaneously on the non-gallium nitride floors 100e. Finally, a conformal region of gallium nitride 110c also may be formed simultaneously on the sidewalls 100c of the non-gallium nitride posts 100a. Growth of the gallium nitride layer 110 preferably is performed using metalorganic vapor phase epitaxy (MOVPE) of triethylgallium (TEG), for example at 13–39 umol/min and NH$_3$ at 1500 sccm in combination with 3000 sccm H$_2$ diluent, at low temperature, preferably at about 1000° C. or less. Additional details of MOCVD growth of gallium nitride may be found in the above-cited publications to Nam et al, Zheleva et al., Zheleva et al. and Linthicum et al. Other growth techniques also may be used.

Details of the growth of gallium nitride layer 110 now will be described. In particular, as shown in FIG. 3, the present invention preferably produces pyramidal gallium nitride seed forms 110a on the tops 110d of the gallium nitride posts 110a. Earlier studies that were conducted on selective area growth of gallium nitride indicated that when gallium nitride pyramids are grown through mask windows, two regions of gallium nitride material result. One region is a relatively high defect density gallium nitride area that converges at the apex of the pyramid. The other region is nearly defect-free and encapsulates the pyramid. See, for example, the publication by Nam et al. entitled *Lateral Epitaxial Overgrowth of GaN Films* on SiO$_2$ *Areas via Metalorganic Vapor Phase Epitaxy*, Journal of Electronic Materials, Vol. 27, No. 4, 1998, pp. 233–237, the disclosure of which is hereby incorporated herein by reference.

According to the invention, the pyramids 110a on the tops 100d of the non-gallium nitride posts 100a can form these same two regions. Once the nearly defect-free region is formed, the growth parameters can be changed to enhance lateral growth of gallium nitride from the relatively defect free regions of the pyramids, and that can result in nearly defect-free gallium nitride epilayers, as will be described below.

In particular, the pyramids preferably are formed at relatively low temperature, preferably about 1000° C. or less using metalorganic vapor phase epitaxy, as was described above. The pyramids may be grown to have a width of about 2 $\mu$m and a height of about 2 $\mu$m on posts that are 1 $\mu$m wide. In this case, the interior portions 110a' of the pyramids 110a having a width of about 1 $\mu$m and a height of about 1 $\mu$m, may have a high defect density of about $10^8$ cm$^{-2}$ or more, whereas the outer portions 110a" of the pyramids 110a may be relatively low in defect, for example having defect density of about $10^5$ cm$^{-2}$ or less. The conformal layer 110c on the sidewalls 100c of the posts 100a also may have a high defect density and the second pyramids 110b on the floor 100e also may have high defect density, for example greater than about $10^8$ cm$^{-2}$. It also will be understood that in FIG. 3, masks need not be used prior to or during the growth of the gallium nitride layer 110.

Figure 4:
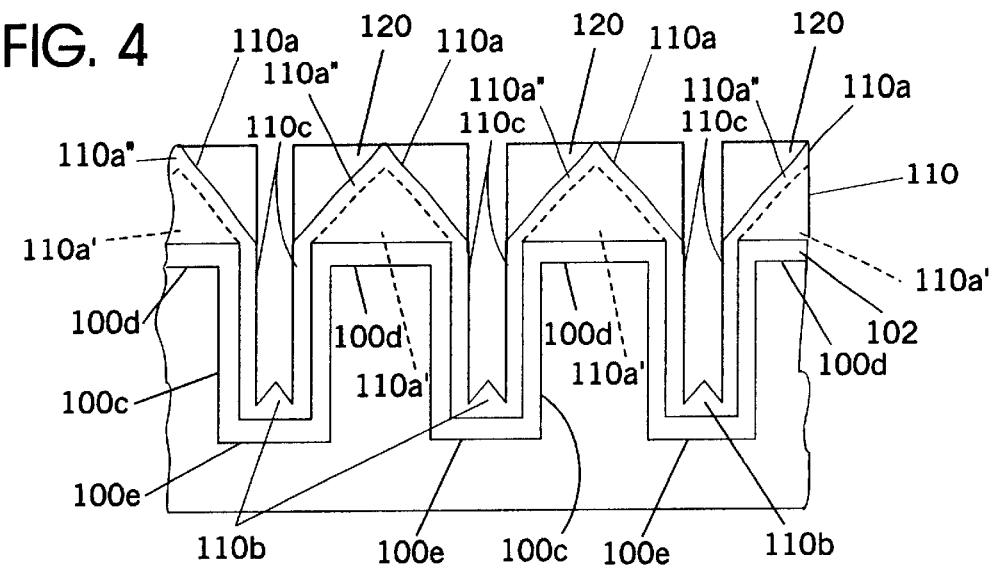

Referring now to FIG. 4, gallium nitride 120 then is preferentially laterally grown on the gallium nitride pyramids 110a. Moreover, as shown in FIG. 4, vertical growth also may occur. It will be understood that, as used herein, the term "lateral" means a direction that is orthogonal to the sidewalls 100c. As used herein, the term "vertical" denotes a direction parallel to the sidewalls 100c.

Figure 5:
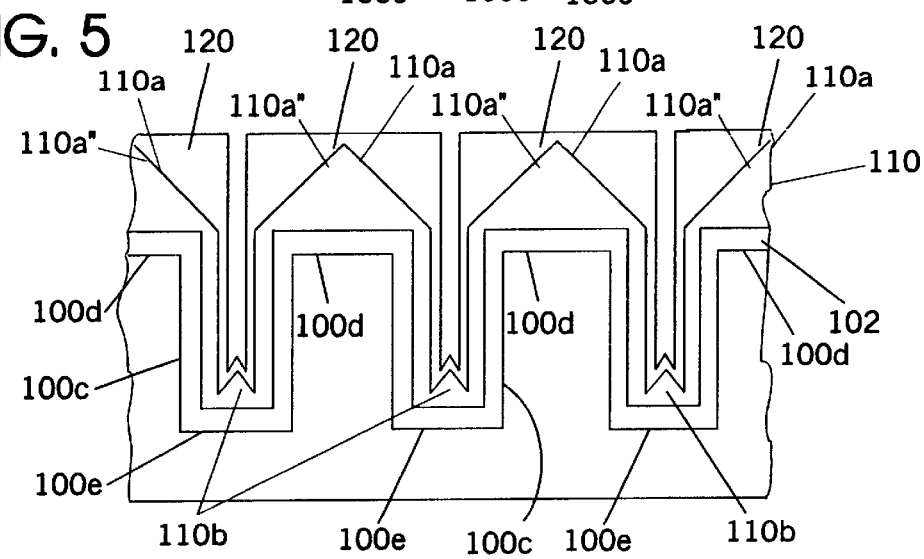
Figure 6:
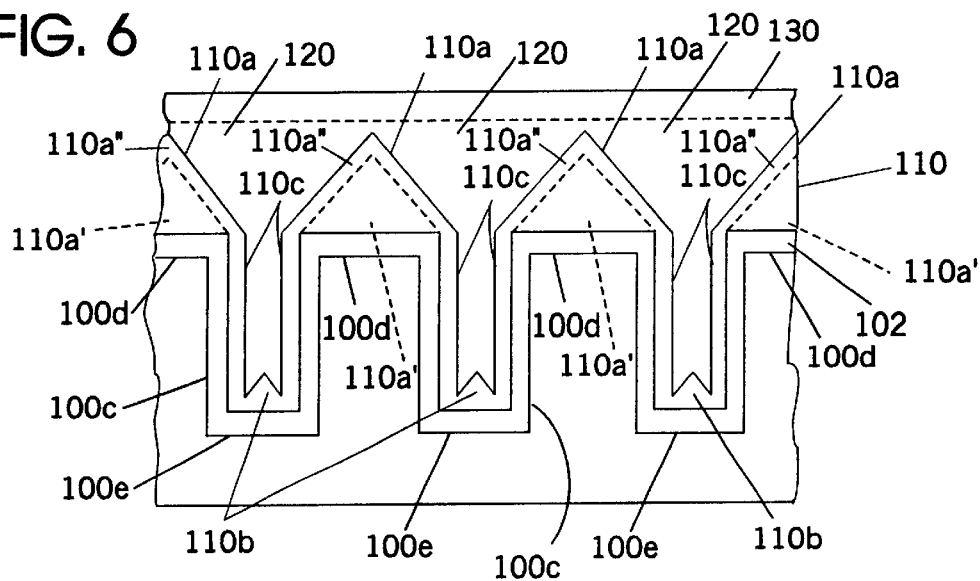

For stripes oriented along the $1\overline{1}00$ direction, the crystal morphology may change as the temperature increases. Thus, at lower temperatures, for example at about 1000° C. or less, a pyramidal cross-section may result as was shown in FIG. 3. At higher temperatures, for example at about 1100° C. or more, a rectangular cross-section may result. Thus, by increasing the temperature, for example to about 1100° C. or more, and preferably without changing any other growth parameters, gallium nitride 120 is preferentially laterally grown from the outer portions 110" of the pyramids 110a. Similar to ELO or pendeoepitaxy of gallium nitride, growth from the low defect outer portions 110a" of the pyramids 110a may have a lower density of line and planar defects. As shown in FIGS. 5 and 6, growth preferably is allowed to continue until the gallium nitride layer 120 coalesces on the tops 100d of the posts 100a to form a continuous gallium nitride semiconductor layer 130. The trenches 100b also preferably are filled with gallium nitride during this growth.

It will be understood that the III–V precursor ratio also may be changed during metalorganic vapor phase epitaxy to increase lateral growth relative to the vertical growth. It will be understood that the III–V precursor ratio also may be changed during seed form growth, to produce pointed or flat top seed forms. In particular, lateral growth may be enhanced by increasing the ammonia (Group V) flux and/or decreasing the gallium (Group III) flux, such that the overall V/III ratio increases. Once the gallium nitride layer 120 coalesces, vertical growth of the continuous gallium nitride layer 130 may be enhanced by decreasing the ammonia flux and/or by increasing the gallium flux, such that the overall V/III ratio decreases.

The growth of gallium nitride shown in FIGS. 3–6 need not use a mask Accordingly, a low defect continuous gallium nitride layer 130 may be fabricated without the need to form a mask on a gallium nitride layer. Process simplification thereby may occur. Moreover, the formation of the pyramids 110a and the subsequent formation of the gallium nitride layer 120 may be performed in a single growth chamber, preferably by increasing the temperature and by leaving the other process parameters unchanged. Simplified processing therefore also may be provided.

Accordingly, low defect density gallium nitride semiconductor layers, having defect density of about $10^5$ cm$^{-2}$ or less may be grown on substrates including silicon, silicon carbide and/or other materials. Growth masks may be eliminated, and high quality gallium nitride may be formed in one growth run. The gallium nitride seed pyramids 110a can confine the threading dislocations that stem from heteroepitaxial growth. Defect densities of less than about $10^5$ cm$^{-2}$ may be obtained within the volume of the laterally grown gallium nitride material. The maximum volume of the low defect density gallium nitride layer 130 need only be limited by the size of the substrate. Line defects that stem from the lattice misfit between the substrate and the epilayers preferably converge at the apex of the pyramid 110a', thereby confining most of the defects to the interior portion 110a'.

Referring again to FIG. 6, gallium nitride structures according to the present invention comprise a substrate 100 including a plurality of non-gallium nitride posts 100a that define trenches 100b therebetween. The non-gallium nitride posts 100a include non-gallium nitride sidewalls 100c and non-gallium nitride tops 100d. The trenches include non-gallium nitride floors 100e. A gallium nitride layer 100 is included on the non-gallium nitride posts 100a including on the non-gallium nitride tops 100d. The gallium nitride layer 110 preferably comprises gallium nitride pyramids 110a on the non-gallium nitride tops 100d. Gallium nitride regions 120 may be provided on the gallium nitride pyramids 110a. Second gallium nitride pyramids 110b also may be provided on the non-gallium nitride floors 100e. A conformal gallium nitride layer 110c also may be provided on the sidewalls 100c between the gallium nitride pyramids 110a and the second gallium nitride pyramids 110b. The gallium nitride regions 120 preferably form a continuous gallium nitride layer 130. The gallium nitride layer 110 also preferably fills the trenches. A conformal buffer layer 102 also may be provided on the substrate, wherein the gallium nitride layer 110 is on the conformal buffer layer 102 opposite the substrate 100.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of fabricating gallium nitride semiconductor structures comprising the steps of:
   providing a substrate including a plurality of non-gallium nitride posts that define trenches therebetween, the non-gallium nitride posts including non-gallium nitride sidewalls and non-gallium nitride tops, and the trenches including non-gallium nitride floors;
   growing gallium nitride on the non-gallium nitride posts, including growing gallium nitride pyramids on the non-gallium nitride tops; and
   growing gallium nitride on the gallium nitride pyramids.

2. A method according to claim 1 wherein the step of growing gallium nitride pyramids comprises the step of simultaneously growing gallium nitride pyramids on the non-gallium nitride tops and on the non-gallium nitride floors.

3. A method according to claim 2 wherein the step of growing gallium nitride pyramids further comprises the step of simultaneously growing a conformal gallium nitride layer on the sidewalls, between the gallium nitride pyramids on the non-gallium nitride tops and on the non-gallium nitride floors.

4. A method according to claim 1 wherein the step of growing gallium nitride on the gallium nitride pyramids comprises the step of growing gallium nitride on the gallium nitride pyramids until the grown gallium nitride coalesces to form a continuous gallium nitride layer.

5. A method according to claim 4 wherein the step of growing gallium nitride on the gallium nitride pyramids further comprises the step of simultaneously filling the trenches with gallium nitride.

6. A method according to claim 1 wherein the step of growing gallium nitride pyramids is performed at a first temperature and wherein the step of growing gallium nitride on the gallium nitride pyramids is performed at a second temperature that is higher than the first temperature.

7. A method according to claim 6 wherein the step of growing gallium nitride pyramids and the step of growing gallium nitride on the gallium nitride pyramids are performed at same processing conditions other than temperature.

8. A method according to claim 1 wherein the growing step comprises the steps of:
   first growing the gallium nitride at a first temperature; and
   then growing the gallium nitride at a second temperature that is higher than the first temperature.

9. A method according to claim 1 wherein the following step is performed between the steps of providing and growing:
   forming a conformal buffer layer on the substrate including on the non-gallium nitride sidewalls, the non-gallium nitride tops and the non-gallium nitride floors.

10. A method according to claim 1 wherein the providing step comprises the steps of:
    providing a non-gallium nitride substrate; and
    etching the non-gallium nitride substrate to define the plurality of non-gallium nitride posts and the trenches therebetween.

11. A method according to claim 8 wherein the first temperature is at most about 1000° C. and wherein the second temperature is at least about 1100° C.

12. A method according to claim 1 wherein the growing step comprises the step of masklessly growing gallium nitride on the non-gallium nitride posts, including on the non-gallium nitride tops.

13. A method according to claim 1 wherein the non-gallium nitride sidewalls expose a 1$\bar{1}$20 plane of the non-gallium nitride posts.

14. A method of fabricating semiconductor structures comprising the steps of:

provising a substrate comprising a first material, the substrate including a plurality of posts that comprise the first material and that define trenches therebetween, the posts including sidewalls and tops that comprise the first material, and the trenches including floors that comprise the first material;

growing a second material on the posts, including growing pyramids of the second material on the first material tops; and growing the second material on the pyramids;

wherein the second material is nitride based semiconductor.

15. A method according to claim 14 wherein the step of growing the second semiconductor material on the pyramids comprises the step of growing the second semiconductor material on the pyramids until the grown second semiconductor material coalesces to form a continuous layer of the second semiconductor material.

16. A method according to claim 14 wherein the following step is performed between the steps of providing and growing:

forming a conformal buffer layer on the substrate including on the sidewalls, the tops and the floors.

17. A method according to claim 14 wherein the growing step comprises the step of masklessly growing the second semiconductor structure material on the posts, including on the tops that comprise the first material.

18. A method according to claim 14 wherein the sidewalls expose a $1\bar{1}20$ plane of the first material.

* * * * *